(12) United States Patent
Ojard (10) Patent No.: US 7,853,859 B2
(45) Date of Patent: Dec. 14, 2010

(54) CONVOLUTIONAL CODING METHOD FOR MULTI-BAND COMMUNICATIONS

(75) Inventor: Eric Ojard, San Francisco, CA (US)

(73) Assignee: Broadcom Corporation, Irvine, CA (US)

( * ) Notice: Subject to any disclaimer, the term of this patent is extended or adjusted under 35 U.S.C. 154(b) by 1351 days.

(21) Appl. No.: 10/981,173

(22) Filed: Nov. 4, 2004

(65) Prior Publication Data
US 2005/0166120 A1    Jul. 28, 2005

Related U.S. Application Data

(60) Provisional application No. 60/538,556, filed on Jan. 23, 2004.

(51) Int. Cl.
H03M 13/00    (2006.01)
(52) U.S. Cl. .................. 714/790; 714/752; 714/758
(58) Field of Classification Search ............... 714/755, 714/781, 790, 752, 758; H03M 13/15, 13/23
See application file for complete search history.

(56) References Cited

U.S. PATENT DOCUMENTS

| | | | | |
|---|---|---|---|---|
| 5,757,856 | A * | 5/1998 | Fang | 375/265 |
| 5,875,214 | A * | 2/1999 | Urbaniak et al. | 375/341 |
| 6,314,289 | B1 * | 11/2001 | Eberlein et al. | 455/427 |
| 6,347,122 | B1 * | 2/2002 | Chen et al. | 375/262 |
| 6,523,147 | B1 * | 2/2003 | Kroeger et al. | 714/792 |
| 6,823,488 | B1 * | 11/2004 | Heegard et al. | 714/786 |
| 7,043,681 | B2 * | 5/2006 | Kroeger | 714/786 |
| 7,685,505 | B2 * | 3/2010 | Showmake | 714/790 |
| 2001/0036232 | A1 * | 11/2001 | Betts | 375/265 |
| 2002/0186790 | A1 * | 12/2002 | Choi et al. | 375/321 |
| 2002/0188908 | A1 * | 12/2002 | Yonge et al. | 714/779 |
| 2003/0074627 | A1 * | 4/2003 | MacDougall | 714/786 |
| 2003/0101401 | A1 * | 5/2003 | Salvi et al. | 714/755 |
| 2004/0151109 | A1 * | 8/2004 | Batra et al. | 370/208 |
| 2005/0091566 | A1 * | 4/2005 | Berens et al. | 714/755 |
| 2005/0141549 | A1 * | 6/2005 | Dottling et al. | 370/465 |
| 2005/0149816 | A1 * | 7/2005 | Eroz et al. | 714/755 |
| 2005/0204269 | A1 * | 9/2005 | Shoemake | 714/790 |
| 2005/0286714 | A1 * | 12/2005 | Tokuda | 379/406.05 |
| 2006/0140142 | A1 * | 6/2006 | Kukla et al. | 370/328 |

OTHER PUBLICATIONS

4i2i Communications ltd., Convolutional Encoder and Viterbi Decoder, Dec. 20, 2001. 4i2i web site: www.4i2i.com/downloads/viterbicoreVHDL212.PDF.*

Convolutional code, Wikipedia. http://en.wikipedia.org/wiki/convolutional_code.*

(Continued)

Primary Examiner—Sam Rizk
(74) Attorney, Agent, or Firm—McAndrews, Held & Malloy, Ltd.

(57) ABSTRACT

A system and method for convolutionally encoding a stream of bits are disclosed. An embodiment of the present invention provides improved communication system performance in comparison to existing convolutional coding, such as that proposed for use in systems employing multi-band, orthogonal frequency division multiplexed signaling. A generator polynomial having a native code rate R=1/3 may be used in combination with puncturing patterns supporting multiple codes rates. The resulting convolutional encoder exhibits improved performance at all code rates, and has no known disadvantages.

20 Claims, 7 Drawing Sheets

OTHER PUBLICATIONS

Morelos-Zaragoza, Robert. The Art of Error Correcting Coding. 2002 John Wiley & Sons.. pp. 94-96.*

Falahati S et al, "Hybrid-Type II ARQ Schemes With Adaptive Modulation Systems for Wireless Channels", Vehicular Technology Conference, 1999-Fall, IEEE VTS 50$^{th}$, Amsterdam, Netherlands, Sep. 19-22, 1999, Piscataway, NJ, USA, IEEE,US, vol. 5 Sep. 19, 1999, pp. 2691-2695, XP010353427, ISBN: 0-7803-5435-4.

Jie Li et al, "A VLC/FLC Data Partitioning Scheme for MPEG-4 ", Circuits and Systems, 2004, ISCAS 2004, Proceedings of the 2004 International Symposium on Vancouver, BC, Canada, May 23-26, 2004, Piscataway, NJ, USA, IEEE, US, pp. 857-860, XP010719703, ISBN: 0-7803-8251-X.

Anuj Butra et al, Multi-Band OFDM Physical Layer Proposal for IEEE 802.15 Task Group 3a >>, Project: IEEE P802.15 Working Group Wireless Personal Area Networks (WPANS), Sep. 15, 2003, pp. 1-69, XP002306910.

Anuj Butra et al, <<Multi-Band OFDM Physical Layer Proposal for IEEE 802.15 Task Group 3a >>, Project: IEEE P802.15 Working Group for Wireless Personal Area Networks (WPANS), Jul. 2003, pp. 1-71, XP002977702.

Haccoun D et al, << High-Rate Punctured Concolutional Codes for Viterbi and sequential Decoding, IEEE Transactions on Communications, IEEE Inc. New York, NY, USA, vol. 37 No. 11, Nov. 1, 1989, pp. 1113-1125, XP000074534.

Sadot PR, "Realization of a Monochip Viterbi Decoder in ASIC Technology", IEEE, Sep. 30, 1990, pp. 249-253, XP010002783.

Cideciyan R D et al, "New Bounds on Convolutional Code Performance Over Fading Channels", Proceedings of IEEE International Symposium on Information Theory, Aug. 1994, p. 270.

* cited by examiner

Puncturing patterns for use with $G=[133\ 165\ 171]_8$

| Rate | Code | $G_1$ | $G_2$ | $G_3$ | P | $d_f$ | $a_n, n=d_f, d_f+1, ...$ $c_n, n=d_f, d_f+1, ...$ | $E_b/N_0$ (dB) @ $P_e$=1e-5 | | |
|---|---|---|---|---|---|---|---|---|---|---|
| | | | | | | | | non-fading | 2-path Rayleigh | Rayleigh |
| 1/3 | MB-OFDM original | 133 | 145 | 175 | 111<br>111<br>111 | 15 | 3,5,5,6,11<br>11,16,19,28,55 | 3.434 | 4.299 | 5.246 |
| | Applicant | 133 | 165 | 171 | 111<br>111<br>111 | 15 | 3,3,6,9,4<br>7,8,22,44,22 | 3.398 | 4.255 | 5.194 |
| 11/32 | MB-OFDM original | 133 | 145 | 175 | 11111111111<br>11111111111<br>11111111111 | 13 | 1,18,40,53,69<br>7,64,134,188,289 | 3.447 | 4.344 | 5.330 |
| | Applicant | 133 | 165 | 171 | 11111111111<br>11111111111<br>11111111110 | 14 | 16,33,49,88<br>39,83,170,374 | 3.403 | 4.290 | 5.265 |
| 3/8 | MB-OFDM original* | 133 | 145 | 175 | 111<br>110<br>111 | 12 | 1,7,15,22,18<br>2,25,54,88,88 | 3.512 | 4.509 | 5.610 |
| | Applicant | 133 | 165 | 171 | 111<br>110<br>111 | 12 | 1,8,13,17,27<br>3,23,37,79,124 | 3.512 | 4.508 | 5.609 |
| 2/5 | MB-OFDM original* | 133 | 145 | 175 | 11<br>10<br>11 | 12 | 10,0,24<br>33,0,101 | 3.573 | 4.655 | 5.858 |
| | Applicant | 133 | 165 | 171 | 11<br>11<br>10 | 11 | 1,3,5,17<br>3,6,14,77 | 3.461 | 4.516 | 5.690 |

Figure 6A

| Rate | Code | $G_1$ | $G_2$ | $G_3$ | $P$ | $d_f$ | $a_n, n=d_f, d_f+1, ...$ $c_n, n=d_f, d_f+1, ...$ | $E_b/N_0$ (dB) @ $P_e$=1e-5 | | |
|---|---|---|---|---|---|---|---|---|---|---|
| | | | | | | | | non-fading | 2-path Rayleigh | Rayleigh |
| 1/2 | MB-OFDM original | 133 | 145 | 175 | 1 0 1 | 9 | 1,6,11,12,45 3,20,57,82,299 | 3.685 | 5.087 | 6.667 |
| | Applicant | 133 | 165 | 171 | 1 0 1 | 10 | 11,0,38,0 36,0,211,0 | 3.673 | 5.070 | 6.643 |
| 5/8 | MB-OFDM original | 133 | 145 | 175 | 11101 00000 10111 | 6 | 5,22,45,156 21,109,277,1169 | 4.206 | 6.232 | 8.611 |
| | MB-OFDM time-reversed | 133 | 145 | 175 | 10111 00000 11101 | 6 | 3,14,44,149 8,62,228,1016 | 4.070 | 6.025 | 8.322 |
| | Other | 133 | 145 | 175 | 11100 10011 01100 | 6 | 1,25,69,177 4,141,436,1359 | 4.117 | 6.093 | 8.398 |
| | Applicant | 133 | 165 | 171 | 10101 10101 01010 | 6 | 1,19,54,153 6,81,281,1128 | 4.040 | 5.981 | 8.243 |
| 3/4 | MB-OFDM original | 133 | 145 | 175 | 110 000 011 | 4 | 1,0,97,0,2312 3,0,765,0,29076 | 4.680 | 7.467 | 10.849 |
| | MB-OFDM time-reversed | 133 | 145 | 175 | 011 000 110 | 5 | 8,47,204,1061 44,415,2140,13825 | 4.569 | 7.263 | 10.501 |
| | Other | 133 | 145 | 175 | 100 000 111 | 5 | 7,37,206,1027 34,261,1973,12299 | 4.525 | 7.189 | 10.387 |
| | Applicant | 133 | 165 | 171 | 100 100 011 | 5 | 4,36,175,882 28,252,1674,11184 | 4.432 | 7.032 | 10.143 |

Figure 6B

CONVOLUTIONAL CODING METHOD FOR MULTI-BAND COMMUNICATIONS

RELATED APPLICATIONS

This application makes reference to, claims priority to, and claims the benefit of U.S. Provisional Patent Application Ser. No. 60/538,556, entitled "Convolutional Coding Method For Multi-Band Communications", filed Jan. 23, 2004, the complete subject matter of which is hereby incorporated herein by reference, in its entirety.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Punctured convolutional codes have been widely used for many years. A punctured convolutional code is a convolutional code in which selected bits are removed, or "punctured", to increase the data rate. For example, a rate 1/2 convolutional code produces two coded bits for every one data bit. If this code is punctured by removing one out of every 4 coded bits, the resulting code rate is 2/3. Such codes are useful because the same encoder and decoder can be used for different code rates.

A punctured convolutional code is uniquely defined by its generator polynomial and a "puncturing" or "perforation" pattern. The generator polynomial defines the relationship between the input bits and the coded bits (before puncturing). The puncturing pattern specifies the pattern in which coded bits are removed. Finding the optimal puncturing pattern can be a difficult task, especially for coding rates in which the number of possibilities is large. Optimal codes have been found for a large number of data rates. However, optimal codes for other data rates remain undiscovered. Optimal codes permit operation at a lower signal-to-noise ratio (SNR) for a given data arte and bit-error probability.

The current Multiband OFDM Alliance (MBOA) proposal uses a generator polynomial of $G=[133\ 145\ 175]_8$. The MBOA proposal specifies four puncturing patterns for code rates of R=11/32, 1/2, 5/8, and 3/4, using quadrature phase shift keying (QPSK). Additional modes with code rates R=1/3 and R=3/8 are also being considered. An alternate code using a generator polynomial $G=[133\ 145\ 175]_8$ and new puncturing patterns with better properties that the MBOA proposal has been suggested for code rates R=5/8 and R=3/4. A description of how the bits are encoded and punctured may be found in the Multiband OFDM Alliance (MBOA) draft specification for Ultra-Wide-Band (UWB) communications. The details of the draft specification for the IEEE 802.15.3a standard may be found in the document "Multi-band OFDM Physical Layer Proposal for IEEE 802.15 Task Group 3a", document IEEE P802.15-03/268r0, dated Jul. 21, 2003, by the Institute of Electrical and Electronics Engineers, Inc., which draft specification is hereby incorporated herein by reference, in its entirety.

The Multi-band OFDM Physical Layer Proposal for IEEE 802.15 Task Group 3a, dated Jul. 21, 2003 specifies a convolutional code and perforation patterns for a number of different code rates. For example, code rates of 1/3, 11/32, 1/2, and 3/4 are provided using a generator polynomial for an original 1/3 rate code, and designated perforation patterns. The performance of the original convolutional codes as proposed in the MBOA draft specification has been found to be suboptimal.

Further limitations and disadvantages of conventional and traditional approaches will become apparent to one of ordinary skill in the art through comparison of such systems with the present invention as set forth in the remainder of the present application with reference to the drawings.

BRIEF SUMMARY OF THE INVENTION

Aspects of the present invention may be seen in a convolutional encoder comprising an input for receiving a stream of data bits, and first, second, and third data paths for modifying the stream of data bits. The first path may modify the stream of data bits according to a first generator polynomial, and may produce a first stream of encoded data bits. The second data path may modify the stream of data bits according to a second generator polynomial, and may produce a second stream of encoded data bits. The third data path may modify the stream of data bits according to a third generator polynomial, and may produce a third stream of encoded data bits. The encoder may also comprise signal processing circuitry for passing, in a repeating order, one encoded data bit from each of the streams of encoded data bits to produce an encoded stream of output bits having a native code rate R=1/3. The signal processing circuitry may be capable of omitting encoded data bits from the encoded stream of output bits according to a predefined puncturing pattern. In various embodiments in accordance with the present invention, the predefined puncturing pattern may result in a code rate R=11/32, 3/8, 1/2, 5/8, and 3/4. The predefined puncturing pattern may be represented in a matrix format, or equivalents thereof, and each row of the matrix may be associated with one of the streams of encoded data bits. Each value in each row of the matrix may represent output, if a 1 (one), or omission, if a 0 (zero), of a corresponding data bit of the associated stream of encoded data bits in the encoded stream of output bits. The first, second, and third generator polynomials, and the predefined puncturing pattern may be employed in bitwise time-reversed order.

Other aspects of the present invention may be found in an encoder circuit for convolutionally encoding a bit stream according to a generator polynomial. The circuit may produce an encoded bit stream subject to a predefined puncturing pattern, and the encoder may have a native code rate R=1/3. In various embodiments of the present invention, the predefined puncturing pattern may result in a code rate R=11/32, 3/8, 1/2, 5/8, and 3/4. The predefined puncturing pattern may be represented by a matrix, or equivalents thereof, and each value in each row of the matrix may represent output, if a 1 (one), or omission, if a 0 (zero), of an encoded data bit in the encoded bit stream. The generator polynomial and the predefined puncturing pattern may be employed in bitwise time-reversed order.

Further aspects of the present invention may be observed in a method of convolutionally encoding a bit stream. Such a method may comprise receiving the bit stream, encoding the received bit stream according to a generator polynomial, and outputting the encoded bit stream. The encoding may produce an encoded bit stream. The method may also comprise puncturing the encoded bit sequence according to a predefined puncturing pattern. In various embodiments in accordance with the present invention, the predefined puncturing pattern may result in a code rate R=11/32, 3/8, 1/2, 5/8, and 3/4. The predefined puncturing pattern may be represented by a matrix, or equivalents thereof, and each value in each row of the matrix may represent output, if a 1 (one), or omission, if a 0 (zero), of an encoded data bit in the encoded bit stream. The generator polynomial and the predefined puncturing pattern may be employed in bitwise time-reversed order.

Still other aspects of the present invention may be seen in a system for convolutionally encoding a bit stream. Such a system may comprise at least one processor capable of receiving the bit stream, and the at least one processor may be capable of encoding the received bit stream according to a generator polynomial. The encoding may produce an encoded bit stream, and the at least one processor may be capable of outputting the encoded bit stream. The at least one processor may also be capable of puncturing the encoded bit sequence according to a predefined puncturing pattern. In various embodiments of the present invention, the predefined puncturing pattern may result in a code rate R=11/32, 3/8, 1/2, 5/8, and 3/4. The predefined puncturing pattern may be represented by a matrix, or equivalents thereof, and each value in each row of the matrix may represent output, if a 1 (one), or omission, if a 0 (zero), of an encoded data bit in the encoded bit stream. The generator polynomial and the predefined puncturing pattern may be employed in bitwise time-reversed order.

These and other features and advantages of the present invention may be appreciated from a review of the following detailed description of the present invention, along with the accompanying figures in which like reference numerals refer to like parts throughout.

DETAILED DESCRIPTION OF THE INVENTION

Aspects of the present invention relate generally to methods of coding information for transmission over communication links prone to errors. More specifically, the present invention relates to methods of using a predetermined convolutional code and selected perforation patterns to improve communication system performance. Although the following discussion illustrates aspects of the present invention with regard to a particular communication system, the utility of the present invention is not limited to the representative embodiments provided herein.

Figure 1:
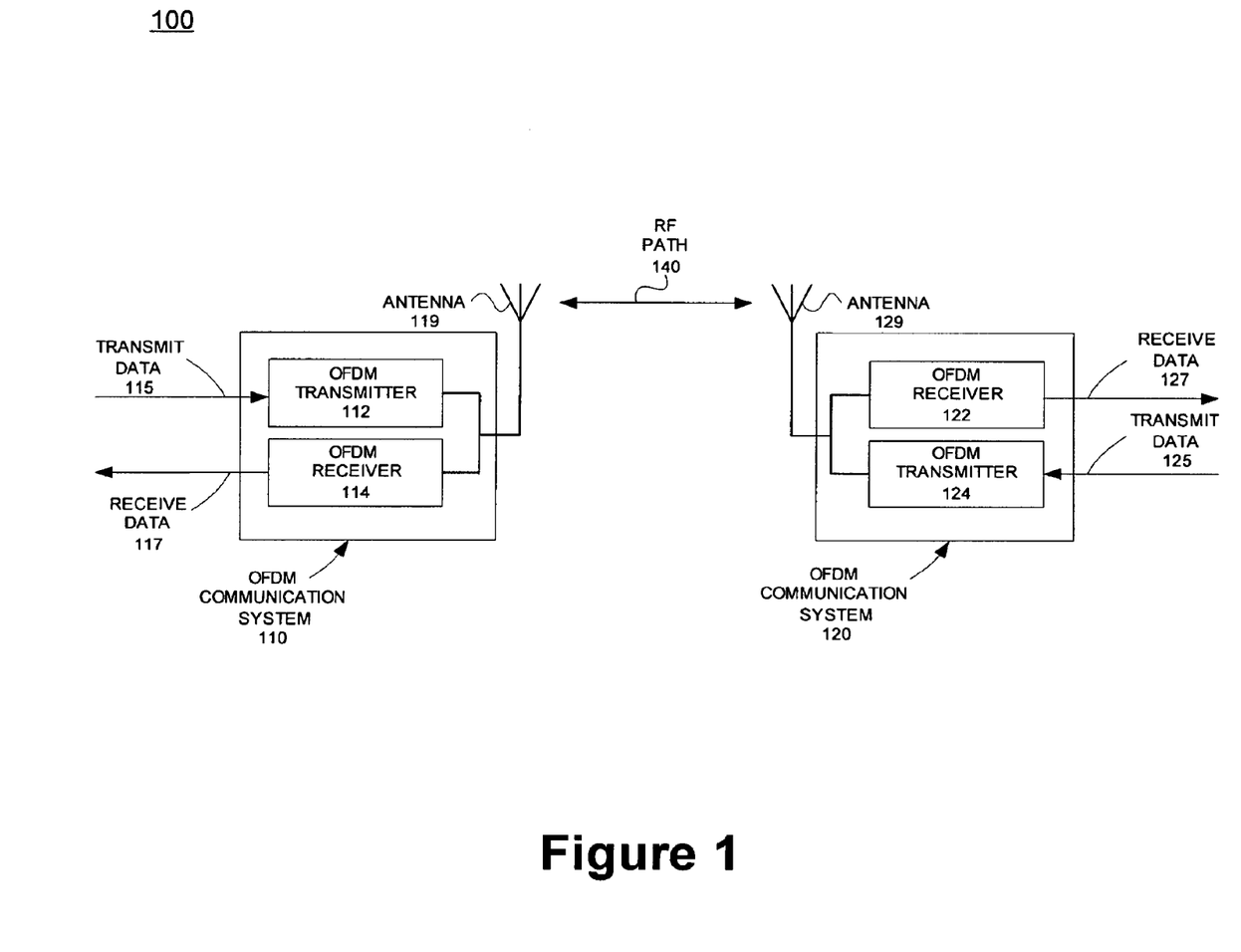
FIG. 1 illustrates a communication network in which an embodiment of the present invention may be practiced.

FIG. 1 illustrates a communication network 100 in which an embodiment of the present invention may be practiced. The communication network 100 of FIG. 1 comprises orthogonal frequency division multiplex (OFDM) communication systems 110, 120 communicatively coupled via RF path 140. The OFDM communication systems 110, 120 may be used to communicate data from one location to the other using, for example, an ultra-wideband radio frequency communication protocol such as that described in the Multi-band OFDM Physical Layer Proposal for IEEE 802.15 Task Group 3a, dated Jul. 21, 2003, prepared by the Institute of Electrical and Electronics Engineers, Inc. The OFDM communication system 110 comprises an OFDM transmitter 112 and an OFDM receiver 114. The OFDM transmitter 112 and OFDM receiver 114 are communicatively coupled to antenna 119 to enable the exchange of radio frequency signals via RF path 140. Although in the illustration of FIG. 1 the antenna 119 is shown as a single antenna connected to both OFDM transmitter 112 and OFDM receiver 114, the antenna 119 may comprise two or more antennas connected in various arrangements to the OFDM transmitter 112 and OFDM receiver 114. Likewise, the OFDM communication system 120 comprises an OFDM transmitter 122 and an OFDM receiver 124. The OFDM transmitter 124 and OFDM receiver 122 are communicatively coupled to antenna 129 to enable the exchange of radio frequency signals via RF path 140. In a manner similar to antenna 119, the antenna 129 is shown as a single antenna connected to both OFDM transmitter 124 and OFDM receiver 122. The antenna 129 may, however, comprise two or more antennas connected in various arrangements to the OFDM transmitter 124 and OFDM receiver 122.

The OFDM communication system 110 receives transmit data 115 for transmission to OFDM communication system 120. The transmit data 115 is reproduced at OFDM communication system 120 as receive data 127. Similarly, the OFDM communication system 120 receives transmit data 125 for transmission to OFDM communication system 110. The transmit data 125 is reproduced at OFDM communication system 110 as receive data 117. Although the illustration shows only two OFDM communication systems 110, 120, the communication network 100 may comprise a greater number of OFDM communication systems 110, 120 without departing from the spirit of the present invention. Each of the OFDM communication systems 110, 120 may operate in a number of frequency bands, and communicate within the frequency band using a number of sub-carrier or "tone" frequencies.

The RF path 140 of FIG. 1 may be subject to sources of interference including, for example, natural terrestrial and cosmic sources, thermal noise, and other RF transmitters having a transmitter portion such as the transmitter portions of OFDM communication systems 110, 120, operating on the radio frequencies used by the OFDM communication systems 110, 120. The primary sources of interference in OFDM systems such as those shown in FIG. 1 are thermal noise and multi-path interference. Multi-path interference causes frequency-selected fading. In a dense multi-path environment, the frequency-selective fading follows a Rayleigh distribution. This is known as Rayleigh fading. To enable the OFDM communication systems 110, 120 to communicate more effectively in the presence of such interference (e.g., with a lower occurrence of data errors), the OFDM communication systems 110, 120 may encode the transmit data 115 and transmit data 125 before transmission, by employing convolutional codes. The OFDM communication systems 110, 120 may, for example, be ultra-wideband communication systems.

Figure 2:
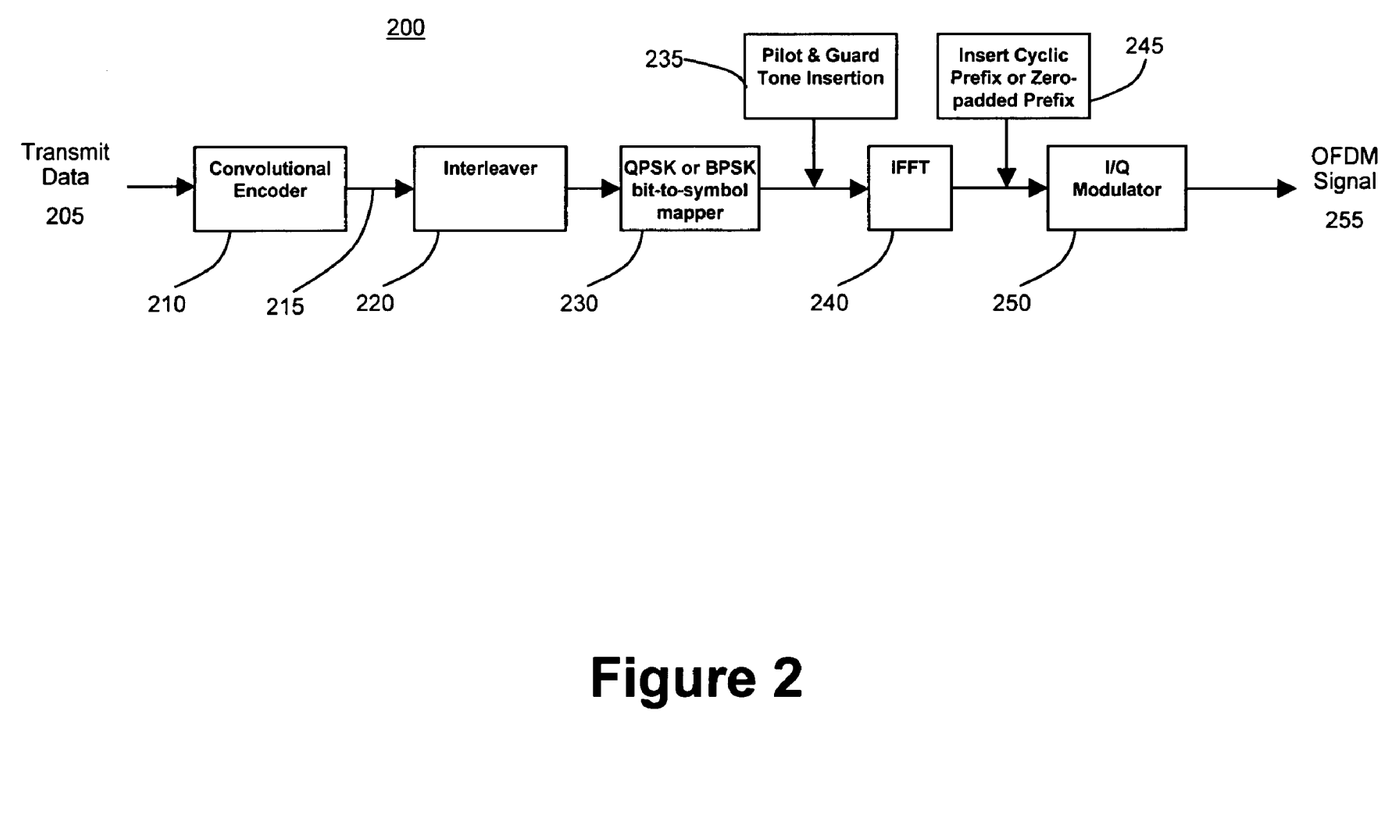
FIG. 2 shows a block diagram of an exemplary communication system that may correspond to the OFDM transmitters shown in FIG. 1, in accordance with a representative embodiment of the present invention.

FIG. 2 shows a block diagram of an exemplary communication system 200 that may correspond to the OFDM transmitters 112, 122 shown in FIG. 1, in accordance with a representative embodiment of the present invention. As illustrated in FIG. 2, the communications system 200 comprises a series of functional blocks including a convolutional encoder block 210, an interleaver block 220, a bit-to-symbol mapper block 230, a pilot and guard tone insertion block 235, an inverse fast Fourier transform (IFFT) block 240, a prefix insertion block 245, and an I/Q modulator block 250. It is a function of the communication system 200 of FIG. 2 to process the transmit data 205 into an orthogonal frequency division multiplex (OFDM) signal 255 for transmission via a radio frequency carrier, such as the RF path 140 of FIG. 1.

Figure 3:
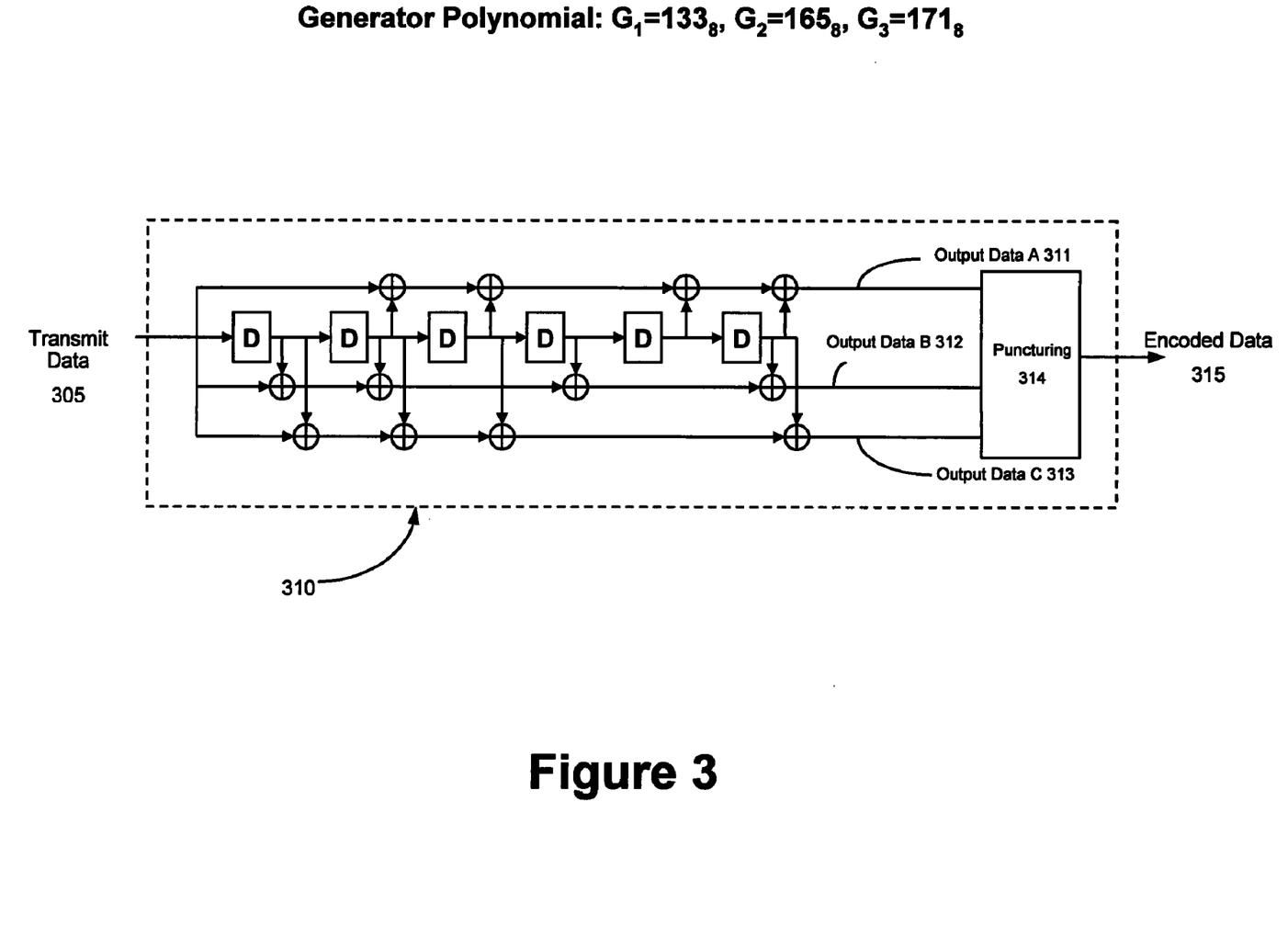
FIG. 3 shows a block diagram of the configuration of a exemplary convolutional encoder that may correspond to the convolutional encoder of FIG. 2, in accordance with a representative embodiment of the present invention.

FIG. 3 shows a block diagram of the configuration of an exemplary convolutional encoder 310 that may correspond to the convolutional encoder 210 of FIG. 2, in accordance with a representative embodiment of the present invention. The configuration of the convolutional encoder 310 in FIG. 3 is typically referred to as a non-recursive convolutional encoder. The transmit data 305 in FIG. 3 may, for example, correspond to the transmit data 205 of FIG. 2, and the encoded data 315 may, for example, correspond to the encoded data 215 of FIG. 2. As illustrated in FIG. 3, the convolutional encoder 310 comprises three signal paths that process the transmit data 305 in parallel, according to a generator polynomial, G, having three parts $G_1=133_8$, $G_2=165_8$, and $G_3=171_8$. The generator polynomial G may also be denoted as $G=[133\ 165\ 171]_8$. As the illustration of FIG. 3 shows, the convolutional encoder 310 produces up to three bits of encoded data 315 for each bit of un-encoded transmit data 305. In a representative embodiment of the present invention, a puncturing block 314 may function to perform puncturing of data from the three signal paths output data A 311, output data B 312, and output data C 313, according to a puncturing pattern of the present invention. The result is the stream of encoded and punctured encoded data 315.

Figure 4A:
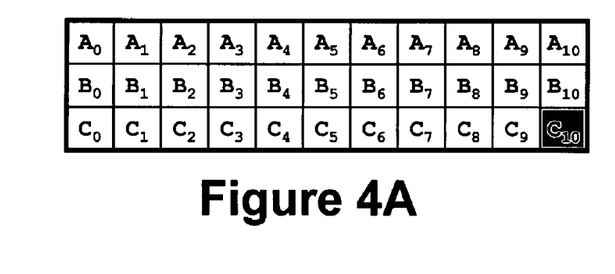
FIG. 4A shows an illustration of an exemplary puncturing pattern for use with a convolutional encoder having a generator polynomial G=[133 165 171]$_8$ such as, for example, the convolutional encoder of FIG. 3, to produce a code of rate R=11/32, in accordance with a representative embodiment of the present invention.

FIG. 4A shows an illustration of an exemplary puncturing pattern for use with a convolutional encoder having a generator polynomial $G=[133\ 165\ 171]_8$ such as, for example, the convolutional encoder 310 of FIG. 3, to produce a code of rate R=11/32, in accordance with a representative embodiment of the present invention. In the exemplary convolutional encoder 310 of FIG. 3, the first or top row of the puncturing pattern shown in FIG. 4A may be applied to the stream of output data A 311, the second or middle row of the puncturing pattern shown in FIG. 4A may be applied to the stream of output data B 312, and the third or bottom row of the puncturing pattern shown in FIG. 4A may be applied to the stream of output data C 313. Each of the rows of the puncturing pattern shown in FIG. 4A is arranged in a left-to-right order of advancing time. The shaded boxes in FIG. 4A represent punctured bits, i.e., those bits that are not transmitted across the communication channel. Using the puncturing patterns shown in FIG. 4A, selected bits are removed from the three coded output streams output data A 311, output data B 312, and output data C 313 of the convolutional coder 310 shown in FIG. 3, for rates other than the native code rate of R=1/3. When used in combination with the generator polynomial $G=[133\ 165\ 171]_8$ of the present invention, the puncturing pattern of FIG. 4A results in a code rate R=11/32. That is, for each 11 bits of transmit data, 32 coded bits are produced at encoded data 315.

Figure 4B:
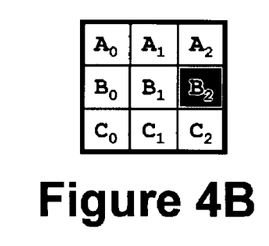
FIG. 4B shows an illustration of an exemplary puncturing pattern for use with a convolutional encoder having a generator polynomial G=[133 165 171]$_8$ such as, for example, the convolutional encoder of FIG. 3, to produce a code of rate R=3/8, in accordance with a representative embodiment of the present invention.

FIG. 4B shows an illustration of an exemplary puncturing pattern for use with a convolutional encoder having a generator polynomial $G=[133\ 165\ 171]_8$ such as, for example, the convolutional encoder 310 of FIG. 3, to produce a code of rate R=3/8, in accordance with a representative embodiment of the present invention. The puncturing pattern of FIG. 4B when used in combination with the generator polynomial $G=[133\ 165\ 171]_8$ of the present invention, results in a code rate R=3/8. That is, for each three bits of transmit data, eight coded bits are produced.

Figure 4C:
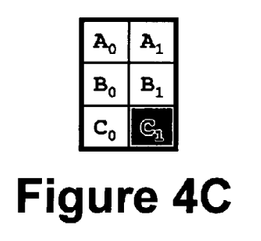
FIG. 4C shows an illustration of an exemplary puncturing pattern for use with a convolutional encoder having a generator polynomial G=[133 165 171]$_8$ such as, for example, the convolutional encoder of FIG. 3, to produce a code of rate R=2/5, in accordance with a representative embodiment of the present invention.

FIG. 4C shows an illustration of an exemplary puncturing pattern for use with a convolutional encoder having a generator polynomial $G=[133\ 165\ 171]_8$ such as, for example, the convolutional encoder 310 of FIG. 3, to produce a code of rate R=2/5, in accordance with a representative embodiment of the present invention. The puncturing pattern of FIG. 4C when used in combination with the generator polynomial $G=[133\ 165\ 171]_8$ of the present invention, results in a code rate R=2/5. That is, for each two bits of transmit data, five coded bits are produced.

Figure 4D:
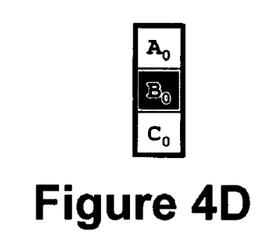
FIG. 4D shows an illustration of an exemplary puncturing pattern for use with a convolutional encoder having a generator polynomial G=[133 165 171]$_8$ such as, for example, the convolutional encoder of FIG. 3, to produce a code of rate R=1/2, in accordance with a representative embodiment of the present invention.

FIG. 4D shows an illustration of an exemplary puncturing pattern for use with a convolutional encoder having a generator polynomial G=[133 165 171]$_8$ such as, for example, the convolutional encoder 310 of FIG. 3, to produce a code of rate R=1/2, in accordance with a representative embodiment of the present invention. The puncturing pattern of FIG. 4D when used in combination with the generator polynomial G=[133 165 171]$_8$ of the present invention, results in a code rate R=1/2. That is, for each bit of transmit data, two coded bits are produced.

Figure 4E:
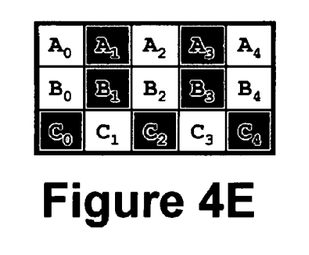
FIG. 4E shows an illustration of an exemplary puncturing pattern for use with a convolutional encoder having a generator polynomial G=[133 165 171]$_8$ such as, for example, the convolutional encoder of FIG. 3, to produce a code of rate R=5/8, in accordance with a representative embodiment of the present invention.

FIG. 4E shows an illustration of an exemplary puncturing pattern for use with a convolutional encoder having a generator polynomial G=[133 165 171]$_8$ such as, for example, the convolutional encoder 310 of FIG. 3, to produce a code of rate R=5/8, in accordance with a representative embodiment of the present invention. The puncturing pattern of FIG. 4E when used in combination with the generator polynomial G=[133 165 171]$_8$ of the present invention, results in a code rate R=5/8. That is, for each five bits of transmit data, eight coded bits are produced.

Figure 4F:
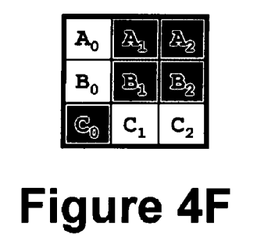
FIG. 4F shows an illustration of an exemplary puncturing pattern for use with a convolutional encoder having a generator polynomial G=[133 165 171]$_8$ such as, for example, the convolutional encoder of FIG. 3, to produce a code of rate R=3/4, in accordance with a representative embodiment of the present invention.

FIG. 4F shows an illustration of an exemplary puncturing pattern for use with a convolutional encoder having a generator polynomial G=[133 165 171]$_8$ such as, for example, the convolutional encoder 310 of FIG. 3, to produce a code of rate R=3/4, in accordance with a representative embodiment of the present invention. The puncturing pattern of FIG. 4F when used in combination with the generator polynomial G=[133 165 171]$_8$ of the present invention, results in a code rate R=3/4. That is, for each three bits of transmit data, four coded bits are produced.

In various representative embodiments of the present invention, the codes produced by the combination of the generator polynomial G=[133 165 171]$_8$ and the puncturing patterns of FIGS. 4A through 4E, outperform both the original MB-OFDM proposal described above, and currently known alternate proposals, at all coding rates. In various representative embodiments, codes for code rates R=11/32, 3/8, 2/5, 5/8, and 3/4 may be used. Code produced by the generator polynomial of the present invention has better behavior than the code of the MBOA proposal, described above, in a three-band system at the native code rate R=1/3, when one band is erased (e.g., severely impaired). A code according to a representative embodiment of the present invention as described herein has no known disadvantages.

Figure 5A:
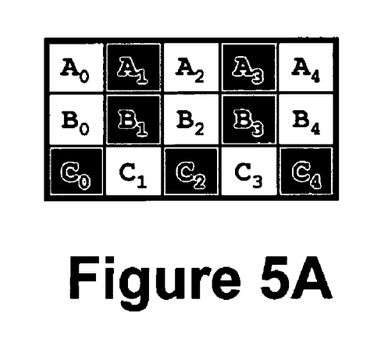
FIGS. 5A and 5B illustrate two exemplary puncturing patterns for use with the generator polynomial G=[133 165 171]$_8$ of the convolutional encoder of FIG. 3, in accordance with a representative embodiment of the present invention.
Figure 5B:
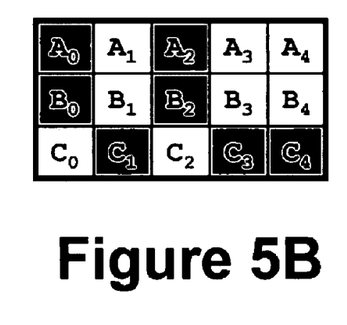

FIGS. 5A and 5B illustrate two exemplary puncturing patterns for use with the generator polynomial G=[133 165 171]$_8$ of the convolutional encoder 310 of FIG. 3, in accordance with an embodiment of the present invention. The puncturing patterns shown in FIGS. 5A and 5B both result in a rate R=5/8 code, and exhibit equivalent performance. The puncturing pattern shown in FIG. 5A is the same as that shown in FIG. 4D. The puncturing pattern illustrated in FIG. 5B is one example of a family of puncturing patterns that result from cyclic shifts of the puncturing pattern shown in FIG. 5A. The performance of codes that result from the use of the generator polynomial G=[133 165 171]$_8$ of the present invention, with the puncturing pattern of FIG. 5B, or other cyclically shifted forms of the puncturing pattern of FIG. 5A, is equivalent to that of the generator polynomial of the present invention in combination with the puncturing pattern of FIG. 5A.

Figure 5C:
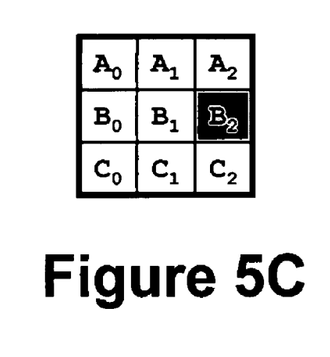
FIGS. 5C and 5D illustrate two additional exemplary puncturing patterns for use with the generator polynomial G=[133 165 171]$_8$ of the convolutional encoder of FIG. 3, in accordance with a representative embodiment of the present invention.
Figure 5D:
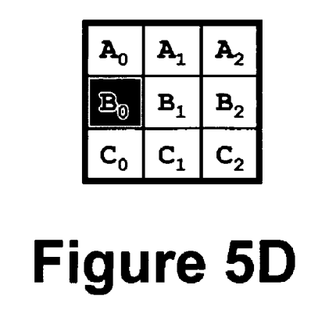

The same holds true for the puncturing patterns shown in FIGS. 4A through 4C and 4E. For example, FIGS. 5C and 5D illustrate two additional exemplary puncturing patterns for use with the generator polynomial G=[133 165 171]$_8$ of the convolutional encoder 310 of FIG. 3, in accordance with an embodiment of the present invention. The puncturing patterns shown in FIGS. 5C and 5D both result in a rate R=3/4 code, and exhibit equivalent performance, in accordance with an embodiment of the present invention. The puncturing pattern shown in FIG. 5C is the same as that shown in FIG. 4E. The puncturing pattern illustrated in FIG. 5D is one example of a family of puncturing patterns that result from cyclic shifts of the puncturing pattern shown in FIG. 5C. The performance of codes that result from the use of the generator polynomial G=[133 165 171]$_8$ of the present invention with the puncturing pattern of FIG. 5D, or other cyclically shifted forms of the puncturing pattern of FIG. 5C, is equivalent to that of the generator polynomial of the present invention with the puncturing pattern of FIG. 5C.

A code in accordance with an embodiment of the present invention may be represented in several different ways. For example, cyclic rotations or shifts of a puncturing pattern do not change the properties of the code. Such variations on a code are considered to be the same code. It should also be noted that time-reversing both the puncturing pattern and the generator polynomial, together, does not change the properties of the resulting code. For example, the time-reversal of [133 165 171]$_8$ is [155 127 117]$_8$. In addition, re-ordering the rows of the puncturing pattern together with the order of the output streams of the encoder does not change the properties of the code. All of these variations are considered to be the same code.

In general, a convolutional code may be characterized by its weight spectrum. The weight spectrum of a code may be defined by:

$a_n$=the number of incorrect paths of Hamming weight, n, and $c_n$=the total number of bit errors on all incorrect paths of Hamming weight, n.

The free distance, $d_f$, is the minimum weight, n, for which $a_n>0$. One method that may be used to find the code with the best performance is to choose the code with the largest free distance, $d_f$, and the fewest neighbors at that distance. A more precise approach is to find the signal-to-noise ratio (SNR) at which the error curve for the code crosses a target error rate, using higher-order elements of the weight spectrum in the error curves. The probability of error curve, $P_e$, is determined by $a_n$—(useful when any error results in a retransmission). The bit-error-rate curve, $P_b$, is determined by $c_n$ (useful when bit errors can be corrected at a higher layer).

For non-fading (i.e. flat) channels with AWGN (additive white Gaussian noise), the error event rate, $P_e$, and bit error probability, $P_b$, may be accurately estimated using the Union Bound:

$$P_e \le \sum_{n=d_f}^{\infty} a_n \cdot Q(\sqrt{n \cdot \text{SNR}}) \qquad P_b \le \sum_{n=d_f}^{\infty} c_n \cdot Q(\sqrt{n \cdot \text{SNR}})$$

The performance on dense multi-path channels may be estimated by assuming independent Rayleigh fading. Close examination of the IEEE 802.15 TG3a channel models shows that all channel models exhibit frequency-selective Rayleigh fading. Because of the high ratio of signal bandwidth to coherence bandwidth, individual channels exhibit relative little deviation from this distribution. Assuming a well-designed interleaver, independent Rayleigh fading may be assumed.

An upper bound on the bit error probability for Rayleigh fading channels is described in the document "New Bounds on Convolutional Code Performance over Fading Channels", by R. D. Cideciyan and E. Eleftheriou, IEEE Transactions on Communications, Vol. 37, No. 11, November 1989, the complete subject matter of which is hereby incorporated herein, in its entirety. The following bounds may be used to determine limits on the error event rate, $P_e$, and bit error probability, $P_b$:

$$P_e < \frac{1}{2k} \sum_{n=d_f}^{\infty} a_n \frac{\Gamma\left(n-\frac{1}{2}\right)}{\Gamma(n)\sqrt{\pi\gamma_s}} \left(\frac{1}{1+\gamma_s}\right)^{n-\frac{1}{2}}$$

$$P_b < \frac{1}{2k} \sum_{n=d_f}^{\infty} c_n \frac{\Gamma\left(n-\frac{1}{2}\right)}{\Gamma(n)\sqrt{\pi\gamma_s}} \left(\frac{1}{1+\gamma_s}\right)^{n-\frac{1}{2}}$$

where $d_f$ is the free distance of a rate R=k/n convolutional code; $a_n$ is the number of incorrect paths of Hamming weight n; $c_n$ is the total number of non-zero information bits on all weight n paths; $\Gamma(.)$ is the gamma function; and $\gamma_s$ is the symbol energy to noise power spectral density ratio, i.e., $\gamma_s$=SNR/2. For modes without frequency-spreading, the Rayleigh-fading bound may be used directly. For modes with frequency-spreading (i.e., diversity), the code weight may be multiplied by the diversity factor, and the same equation may be used (e.g., for two-path diversity, n should be replaced by 2n in all occurrences of n to the right of $a_n$ or $c_n$ in the above bounds for $P_e$ and $P_b$, respectively.)

Figure 6A:
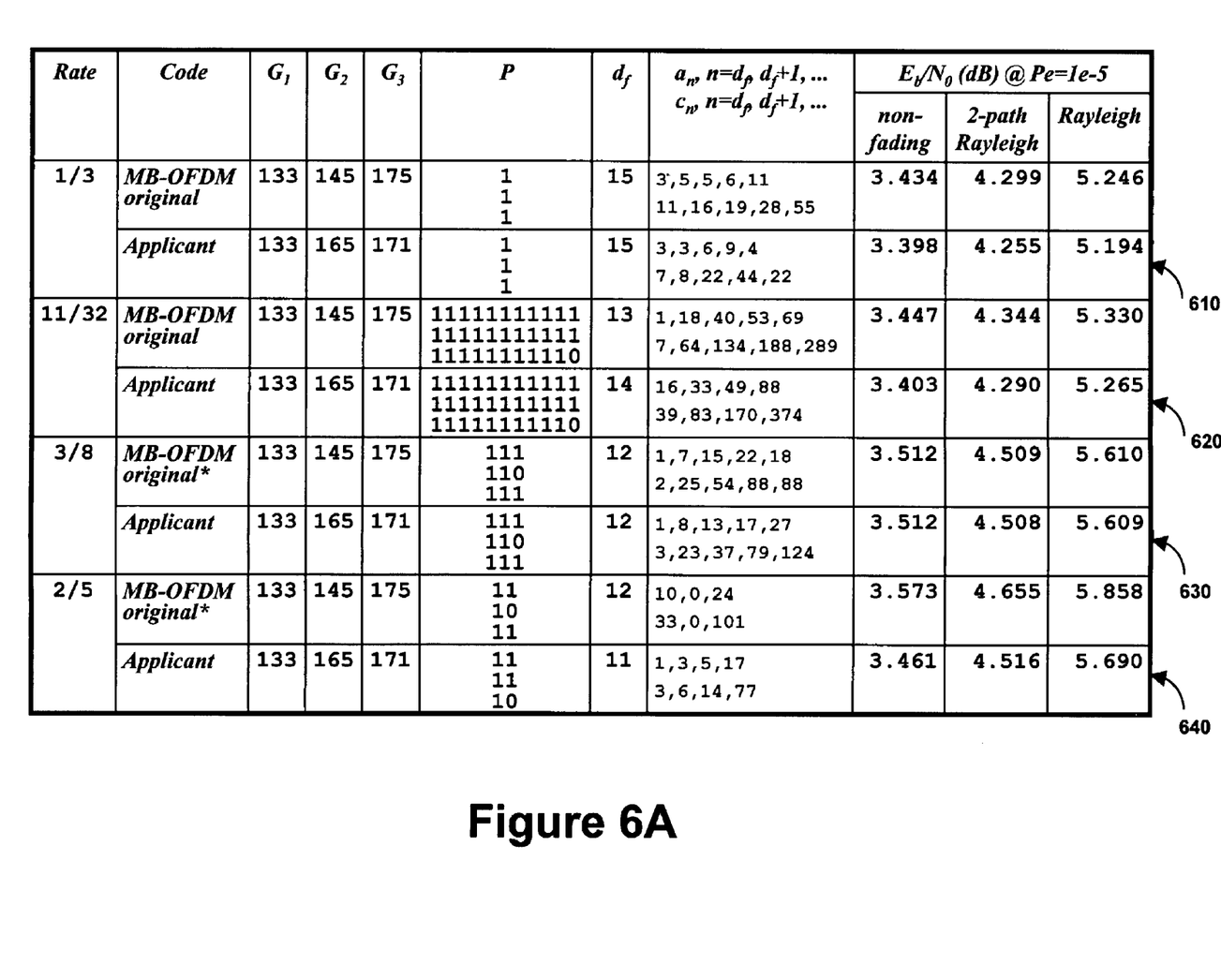
FIG. 6A shows a table comparing the performance of the codes of the MBOA proposal to the performance of the codes generated using the generator polynomial G=[133 165 171]$_8$ at the native rate R=1/3, and when used with the puncturing patterns of FIGS. 4A through 4C for rates R=11/32, 3/8, and 2/5, in accordance with a representative embodiment of the present invention.
Figure 6B:
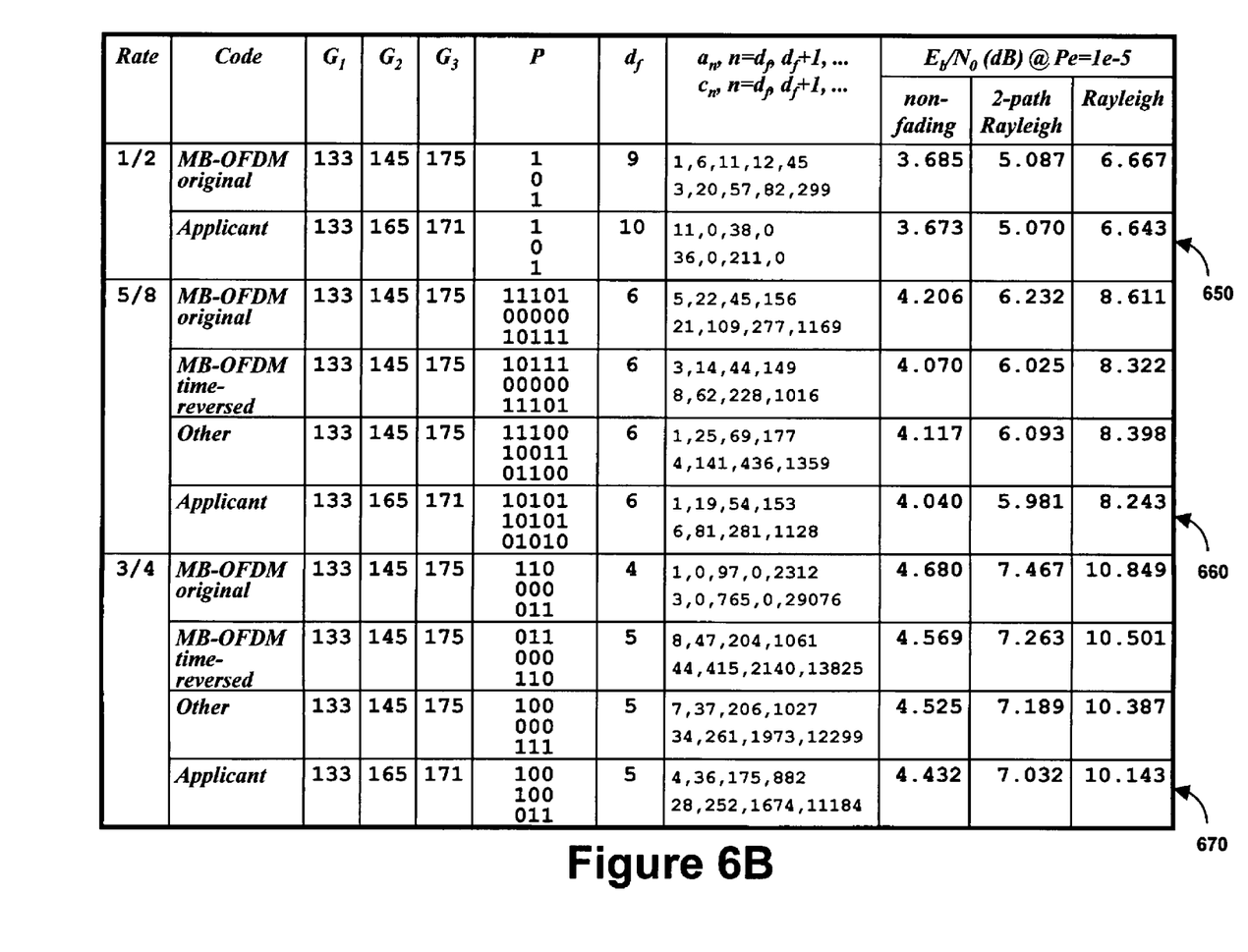
FIG. 6B shows a table comparing the performance of the codes of the MBOA proposal to the performance of the codes generated using the generator polynomial G=[133 165 171]$_8$ and the puncturing patterns of FIGS. 4D, 4E, and 4F for rates R=1/2, 5/8, and 3/4, in accordance with a representative embodiment of the present invention.

FIG. 6A shows a table comparing the performance of the codes of the MBOA proposal to the performance of the codes generated using the generator polynomial G=[133 165 171]$_8$ at the native rate R=1/3, and when used with the puncturing patterns of FIGS. 4A through 4C for rates R=11/32, 3/8, and 2/5, in accordance with a representative embodiment of the present invention. Although not included in the original MB-OFDM proposal, the rate R=3/8 and R=2/5 codes and puncturing patterns are shown in the table of FIG. 6A for purposes of comparison. FIG. 6B shows a table comparing the performance of the codes of the MBOA proposal to the performance of the codes generated using the generator polynomial G=[133 165 171]$_8$ and the puncturing patterns of FIGS. 4D, 4E, and 4F for rates R=1/2, 5/8, and 3/4, in accordance with a representative embodiment of the present invention. The puncturing pattern, P, is represented in the tables of FIGS. 6A and 6B as a binary matrix, where zeros correspond to punctured bits. These tables also give the weight spectrum of the code, following the notation used in the document "High-Rate Punctured Convolutional Codes for Viterbi and Sequential Decoding", by David Haccoun and Guy Begin, IEEE Transactions on Communications, Vol. 37, No. 11, November 1989, the complete subject matter of which is hereby incorporated herein, in its entirety. The above reference by Haccoun and Begin may be consulted for additional information concerning the weight spectrum of a code.

The three right-most columns of FIGS. 6A and 6B tabulate the performance of each code under different fading conditions. These columns indicate the signal-to-noise ratio ($E_b/N_0$) required to operate at the target error rate (i.e., $P_e$=e−5). The code with the best performance under a given set of operating conditions is that code with the lowest signal-to-noise ratio. Although the performance of codes in accordance with an embodiment of the present invention are better than the corresponding code from the MB-OFDM proposal and known alternate proposals, as shown in the rows of FIG. 6A for code rates R=1/3 (610), 11/32 (620), 3/8 (630), and 2/5 (640) at all code rates, it can be seen from FIG. 6B that the difference of the performance of an embodiment of the present invention and the prior art is especially significant for code rates R=1/2 (650), 5/8 (660), and R=3/4 (670).

The largest improvements in code performance for embodiments of the present invention occur at the highest data rates. For example, at 480 megabits per second (Mbps), with the rate R=3/4 code of the present invention, and no diversity, the code in accordance with an embodiment of the present invention gains 0.71 dB when compared to the originally proposed MB-OFDM code, 0.36 dB when compared to a time-reversed version of the originally proposed MB-OFDM code, and 0.24 dB compared to the alternate code proposal previously discussed. Using a somewhat lower data rate of 400 Mbps and the rate R=5/8 code of the present invention (with no diversity), the code in accordance with an embodiment of the present invention gains 0.36 dB when compared to the originally proposed MB-OFDM code, 0.08 dB when compared to the time-reversed version of the originally proposed MB-OFDM code, and 0.16 dB when compared to the alternate ("other") code proposal. Using a still lower data rate of 200 Mbps and the rate R=5/8 code of the present invention (with two-path diversity), the code in accordance with an embodiment of the present invention gains 0.25 dB when compared to the originally proposed MB-OFDM code, 0.04 dB when compared to the MB-OFDM time-reversed code, and 0.11 dB when compared to the alternate code proposal.

In a three-band system, which is the mandatory operating mode of the original MB-OFDM proposal, with a code rate R=1/3, each of the three output bit-streams are mapped to a different frequency band. If one frequency band experiences severe impairment (e.g. due to interference), this has the effect of puncturing the code to a code rate R=1/2. With the original MB-OFDM proposal, the three possibilities for the generator polynomial are G=[133 145]$_8$, G=[133 175]$_8$, and G=[145 175]$_8$. The generator polynomial G=[145 175]$_8$ is known to exhibit particularly poor behavior. In contrast, the code for rate R=1/2 in accordance with an embodiment of the present invention is well-behaved in all three cases where one frequency band is lost (i.e., G=[133 165]$_8$, G=[133 171]$_8$, and G=[165 171]$_8$.). This results in robust immunity to interference for the code rate R=1/3, in an embodiment in accordance with the present invention.

As discussed above, a representative embodiment of the present invention achieves better performance than existing codes at all data rates, with substantial gains in performance over prior codes at higher data dates. In addition, an embodiment of the present invention is well-behaved in a three band system at a rate R=1/3, when one band suffers severe impairment.

The present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. An encoding system, comprising:
   a non-recursive convolutional encoder comprising:
   an input for receiving a stream of data bits;
   a first data path for modifying the stream of data bits according to a first generator polynomial $G_1=133$ octal, the first data path producing a first stream of encoded data bits;
   a second data path for modifying the stream of data bits according to a second generator polynomial $G_2=165$ octal, the second data path producing a second stream of encoded data bits;
   a third data path for modifying the stream of data bits according to a third generator polynomial $G_3=171$ octal, the third data path producing a third stream of encoded data bits; and
   signal processing circuitry for passing, in a repeating order, one encoded data bit from each of the first stream, the second and the third stream of encoded data bits to produce an encoded stream of output bits having a native code rate $R=1/3$, the signal processing circuitry capable of omitting encoded data bits from the encoded stream of output bits according to a predefined puncturing pattern to enable transmission of the encoded bitstream, wherein:
   one or more of said first stream, said second stream, and/or said third stream of encoded data bits are generated using a plurality of delay blocks, and
   the predefined puncturing pattern is utilized to produce a code rate of one of $R=11/32$, $R=2/5$, and $R=5/8$.

2. The system of claim 1, wherein the predefined puncturing pattern for the code rate $R=11/32$ is represented in a matrix format as $$\begin{bmatrix} 1 & 1 & 1 & 1 & 1 & 1 & 1 & 1 & 1 & 1 \\ 1 & 1 & 1 & 1 & 1 & 1 & 1 & 1 & 1 & 1 \\ 1 & 1 & 1 & 1 & 1 & 1 & 1 & 1 & 1 & 0 \end{bmatrix},$$

or equivalents thereof, wherein the first row of the matrix is associated with the first stream of encoded data bits, the second row of the matrix is associated with the second stream of encoded data bits, the third row of the matrix is associated with the third stream of encoded data bits, each row of the matrix is in left to right order of advancing time, and wherein each value in each row of the matrix represents output, if a 1 (one), or omission, if a 0 (zero), of a corresponding data bit of the associated stream of encoded data bits in the encoded stream of output bits.

3. The system of claim 1, wherein the predefined puncturing pattern for the code rate $R=2/5$ is represented in a matrix format as $$\begin{bmatrix} 1 & 1 \\ 1 & 1 \\ 1 & 0 \end{bmatrix},$$

or equivalents thereof, wherein the first row of the matrix is associated with the first stream of encoded data bits, the second row of the matrix is associated with the second stream of encoded data bits, the third row of the matrix is associated with the third stream of encoded data bits, each row of the matrix is in left to right order of advancing time, and wherein each value in each row of the matrix represents output, if a 1 (one), or omission, if a 0 (zero), of a corresponding data bit of the associated sequence of encoded data bits in the encoded stream of output bits.

4. The system of claim 1, wherein the predefined puncturing pattern for the code rate $R=5/8$ is represented in a matrix format as $$\begin{bmatrix} 1 & 0 & 1 & 0 & 1 \\ 1 & 0 & 1 & 0 & 1 \\ 0 & 1 & 0 & 1 & 0 \end{bmatrix},$$

or equivalents thereof, wherein the first row of the matrix is associated with the first stream of encoded data bits, the second row of the matrix is associated with the second stream of encoded data bits, the third row of the matrix is associated with the third stream of encoded data bits, each row of the matrix is in left to right order of advancing time, and wherein each value in each row of the matrix represents output, if a 1 (one), or omission, if a 0 (zero), of a corresponding data bit of the associated sequence of encoded data bits in the encoded stream of output bits.

5. The system of claim 1, wherein the first, second, and third generator polynomials, and the predefined puncturing pattern are employed in bitwise time-reversed order.

6. An encoder circuit that is operable to convolutionally and non-recursively encode a bit stream according to a generator polynomial $G=[133\ 165\ 171]_8$ and using a plurality of delay blocks, wherein:
   the encoder circuit produces an encoded bit stream that is subjected to a predefined puncturing pattern and a native code rate $R=1/3$ to enable transmission of the encoded bitstream, and
   the predefined puncturing pattern is utilized to produce a code rate of one of $R=11/32$, $R=2/5$, and $R=5/8$.

7. The encoder circuit of claim 6, wherein the predefined puncturing pattern for the code rate $R=11/32$ is represented by a matrix as $$\begin{bmatrix} 1 & 1 & 1 & 1 & 1 & 1 & 1 & 1 & 1 & 1 \\ 1 & 1 & 1 & 1 & 1 & 1 & 1 & 1 & 1 & 1 \\ 1 & 1 & 1 & 1 & 1 & 1 & 1 & 1 & 1 & 0 \end{bmatrix},$$

or equivalents thereof, wherein the first row of the matrix is associated with the first element of the generator polynomial, the second row of the matrix is associated with the second element of the generator polynomial, the third row of the matrix is associated with the third element of the generator polynomial, and each row of the matrix is in left to right order of advancing time, and wherein each value in each row of the matrix represents output, if a 1 (one), or omission, if a 0 (zero), of an encoded data bit in the encoded bit stream.

8. The encoder circuit of claim 6, wherein the predefined puncturing pattern for the code rate R=2/5 is represented by a matrix as $$\begin{bmatrix} 1 & 1 \\ 1 & 1 \\ 1 & 0 \end{bmatrix},$$

or equivalents thereof, wherein the first row of the matrix is associated with the first element of the generator polynomial, the second row of the matrix is associated with the second element of the generator polynomial, the third row of the matrix is associated with the third element of the generator polynomial, and each row of the matrix is in left to right order of advancing time, and wherein each value in each row of the matrix represents output, if a 1 (one), or omission, if a 0 (zero), of an encoded data bit in the encoded bit stream.

9. The encoder circuit of claim 6, wherein the predefined puncturing pattern for the code rate R=5/8 is represented by a matrix as $$\begin{bmatrix} 1 & 0 & 1 & 0 & 1 \\ 1 & 0 & 1 & 0 & 1 \\ 0 & 1 & 0 & 1 & 0 \end{bmatrix},$$

or equivalents thereof, wherein the first row of the matrix is associated with the first element of the generator polynomial, the second row of the matrix is associated with the second element of the generator polynomial, the third row of the matrix is associated with the third element of the generator polynomial, and each row of the matrix is in left to right order of advancing time, and wherein each value in each row of the matrix represents output, if a 1 (one), or omission, if a 0 (zero), of an encoded data bit in the encoded bit stream.

10. The encoder circuit of claim 6, wherein the generator polynomial and the predefined puncturing pattern are employed in bitwise time-reversed order.

11. A method of encoding a bit stream, the method, comprising:
   receiving, in a non-recursive convolutional encoder, the bit stream;
   encoding the received bit stream according to a generator polynomial G=[133 165 171]$_8$ and using a plurality of delay blocks, the encoding producing an encoded bit stream;
   puncturing the encoded bit sequence according to a predefined puncturing pattern that is utilized to produce a code rate of one of R=11/32, R=2/5, and R=5/8; and
   outputting the encoded and punctured bit stream.

12. The method of claim 11, wherein the predefined puncturing pattern for the code rate R=11/32 is represented by a matrix as $$\begin{bmatrix} 1 & 1 & 1 & 1 & 1 & 1 & 1 & 1 & 1 & 1 & 1 \\ 1 & 1 & 1 & 1 & 1 & 1 & 1 & 1 & 1 & 1 & 1 \\ 1 & 1 & 1 & 1 & 1 & 1 & 1 & 1 & 1 & 1 & 0 \end{bmatrix},$$

or equivalents thereof, wherein the first row of the matrix is associated with the first element of the generator polynomial, the second row of the matrix is associated with the second element of the generator polynomial, the third row of the matrix is associated with the third element of the generator polynomial, and each row of the matrix is in left to right order of advancing time, and wherein each value in each row of the matrix represents output, if a 1 (one), or omission, if a 0 (zero), of an encoded data bit in the encoded bit stream.

13. The method of claim 11, wherein the predefined puncturing pattern for the code rate R=2/5 is represented by a matrix as $$\begin{bmatrix} 1 & 1 \\ 1 & 1 \\ 1 & 0 \end{bmatrix},$$

or equivalents thereof, wherein the first row of the matrix is associated with the first element of the generator polynomial, the second row of the matrix is associated with the second element of the generator polynomial, the third row of the matrix is associated with the third element of the generator polynomial, and each row of the matrix is in left to right order of advancing time, and wherein each value in each row of the matrix represents output, if a 1 (one), or omission, if a 0 (zero), of an encoded data bit in the encoded bit stream.

14. The method of claim 11, wherein the predefined puncturing pattern for the code rate R=5/8 is represented by a matrix as $$\begin{bmatrix} 1 & 0 & 1 & 0 & 1 \\ 1 & 0 & 1 & 0 & 1 \\ 0 & 1 & 0 & 1 & 0 \end{bmatrix},$$

or equivalents thereof, wherein the first row of the matrix is associated with the first element of the generator polynomial, the second row of the matrix is associated with the second element of the generator polynomial, the third row of the matrix is associated with the third element of the generator polynomial, and each row of the matrix is in left to right order of advancing time, and wherein each value in each row of the matrix represents output, if a 1 (one), or omission, if a 0 (zero), of an encoded data bit in the encoded bit stream.

15. The method of claim 11, wherein the generator polynomial and the predefined puncturing pattern are employed in bitwise time-reversed order.

16. A system for encoding a bit stream, the system, comprising:
   one or more processors comprising a non-recursive convolutional encoder, the one or more processors capable of receiving the bit stream;
   the one or more processors being capable of encoding the received bit stream according to a generator polynomial G=[133 165 171]$_8$ and using a plurality of delay blocks, the encoding producing an encoded bit stream;

the one or more processors being capable of puncturing the encoded bit sequence according to a predefined puncturing pattern that is utilized to produce a code rate of one of R=11/32, R=2/5, and R=5/8; and the one or more processors being capable of outputting the encoded and punctured bit stream.

17. The system of claim 16, wherein the predefined puncturing pattern for the code rate R=11/32 is represented by a matrix as $$\begin{bmatrix} 1 & 1 & 1 & 1 & 1 & 1 & 1 & 1 & 1 & 1 \\ 1 & 1 & 1 & 1 & 1 & 1 & 1 & 1 & 1 & 1 \\ 1 & 1 & 1 & 1 & 1 & 1 & 1 & 1 & 1 & 0 \end{bmatrix},$$

or equivalents thereof, wherein the first row of the matrix is associated with the first element of the generator polynomial, the second row of the matrix is associated with the second element of the generator polynomial, the third row of the matrix is associated with the third element of the generator polynomial, and each row of the matrix is in left to right order of advancing time, and wherein each value in each row of the matrix represents output, if a 1 (one), or omission, if a 0 (zero), of an encoded data bit in the encoded bit stream.

18. The system of claim 16, wherein the predefined puncturing pattern for the code rate R=2/5 is represented by a matrix as $$\begin{bmatrix} 1 & 1 \\ 1 & 1 \\ 1 & 0 \end{bmatrix},$$

or equivalents thereof, wherein the first row of the matrix is associated with the first element of the generator polynomial, the second row of the matrix is associated with the second element of the generator polynomial, the third row of the matrix is associated with the third element of the generator polynomial, and each row of the matrix is in left to right order of advancing time, and wherein each value in each row of the matrix represents output, if a 1 (one), or omission, if a 0 (zero), of an encoded data bit in the encoded bit stream.

19. The system of claim 16, wherein the predefined puncturing pattern for the code rate R=5/8 is represented by a matrix as $$\begin{bmatrix} 1 & 0 & 1 & 0 & 1 \\ 1 & 0 & 1 & 0 & 1 \\ 0 & 1 & 0 & 1 & 0 \end{bmatrix},$$

or equivalents thereof, wherein the first row of the matrix is associated with the first element of the generator polynomial, the second row of the matrix is associated with the second element of the generator polynomial, the third row of the matrix is associated with the third element of the generator polynomial, and each row of the matrix is in left to right order of advancing time, and wherein each value in each row of the matrix represents output, if a 1 (one), or omission, if a 0 (zero), of an encoded data bit in the encoded bit stream.

20. The system of claim 16, wherein the generator polynomial and the predefined puncturing pattern are employed in bitwise time-reversed order.

* * * * *